(12) United States Patent
Xie et al.

(10) Patent No.: US 10,915,187 B2
(45) Date of Patent: Feb. 9, 2021

(54) PANEL AND MANUFACTURING METHOD THEREOF

(71) Applicants: BOE Technology Group Co., Ltd., Beijing (CN); Hefei Xinsheng Optoelectronics Technology Co., Ltd., Hefei (CN)

(72) Inventors: Xiaodong Xie, Beijing (CN); Ming Hu, Beijing (CN); Ming Zhang, Beijing (CN); Min He, Beijing (CN); Jing Wang, Beijing (CN)

(73) Assignees: BOE Technology Group Co., Ltd., Beijing (CN); Hefei Xinsheng Optoelectronics Technology Co., Ltd., Anhui (CN)

( * ) Notice: Subject to any disclaimer, the term of this patent is extended or adjusted under 35 U.S.C. 154(b) by 334 days.

(21) Appl. No.: 15/563,378

(22) PCT Filed: Mar. 10, 2017

(86) PCT No.: PCT/CN2017/076246
§ 371 (c)(1),
(2) Date: Sep. 29, 2017

(87) PCT Pub. No.: WO2018/032752
PCT Pub. Date: Feb. 22, 2018

(65) Prior Publication Data
US 2018/0348899 A1 Dec. 6, 2018

(30) Foreign Application Priority Data
Aug. 19, 2016 (CN) .......................... 2016 1 0697354

(51) Int. Cl.
*G06F 3/041* (2006.01)
*C23C 14/35* (2006.01)
(Continued)

(52) U.S. Cl.
CPC .............. *G06F 3/041* (2013.01); *C23C 14/35* (2013.01); *G03F 7/0007* (2013.01); *G03F 7/161* (2013.01); *G06F 2203/04103* (2013.01)

(58) Field of Classification Search
CPC ...................................................... G06F 3/041
See application file for complete search history.

(56) References Cited

U.S. PATENT DOCUMENTS

| 2006/0205103 A1 | 9/2006 | Tamura et al. |
| 2012/0146921 A1* | 6/2012 | Park ........................ G06F 3/044 |
| | | 345/173 |

(Continued)

FOREIGN PATENT DOCUMENTS

| CN | 1755870 A | 4/2006 |
| CN | 203376704 U | 1/2014 |

(Continued)

OTHER PUBLICATIONS

Mar. 13, 2018—(CN) First Office Action 201610697354.5 with English Tran.

(Continued)

*Primary Examiner* — William P Watkins, III
(74) *Attorney, Agent, or Firm* — Banner & Witcoff, Ltd.

(57) ABSTRACT

A panel and a manufacturing method thereof are provided. The panel includes a base substrate, and a black matrix layer, a first organic insulating layer and a second organic insulating layer, which are sequentially disposed on the base substrate. The black matrix layer includes a first groove penetrating through the black matrix layer; the first organic insulating layer includes a second groove penetrating through the first organic insulating layer; the second organic insulating layer includes a third groove penetrating through (Continued)

the second organic insulating layer; and the first groove, the second groove and the third groove are interpenetrated with one another.

18 Claims, 2 Drawing Sheets

(51) Int. Cl.
*G03F 7/00* (2006.01)
*G03F 7/16* (2006.01)

(56) References Cited

U.S. PATENT DOCUMENTS

| | | | |
|---|---|---|---|
| 2014/0204047 A1 | 7/2014 | Lai | |
| 2015/0279912 A1* | 10/2015 | Negishi | H01L 27/3246 257/40 |
| 2016/0154492 A1 | 6/2016 | Luo et al. | |
| 2016/0202521 A1 | 7/2016 | Lee et al. | |
| 2016/0231615 A1 | 8/2016 | Nam et al. | |
| 2016/0377770 A1* | 12/2016 | Kwon | G02B 5/003 359/599 |
| 2017/0059929 A1 | 3/2017 | Wang et al. | |
| 2017/0236847 A1 | 8/2017 | Long | |
| 2018/0046045 A1 | 2/2018 | Chen et al. | |

FOREIGN PATENT DOCUMENTS

| | | |
|---|---|---|
| CN | 103941931 A | 7/2014 |
| CN | 104360785 A | 2/2015 |
| CN | 104765505 A | 7/2015 |
| CN | 105022474 A | 11/2015 |
| CN | 105182580 A | 12/2015 |
| CN | 105206570 A | 12/2015 |
| CN | 105514125 A | 4/2016 |
| CN | 106364197 A | 2/2017 |
| CN | 206331401 U | 7/2017 |

OTHER PUBLICATIONS

Jun. 16, 2017—(WO) International Search Report and Written Opinion Appn PCT/CN2017/076246 with English Tran.

\* cited by examiner

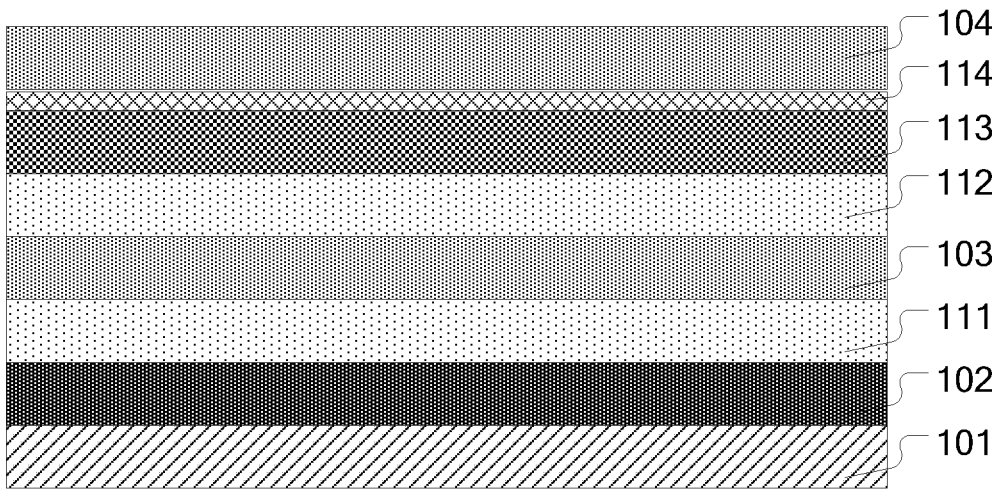

FIG. 4

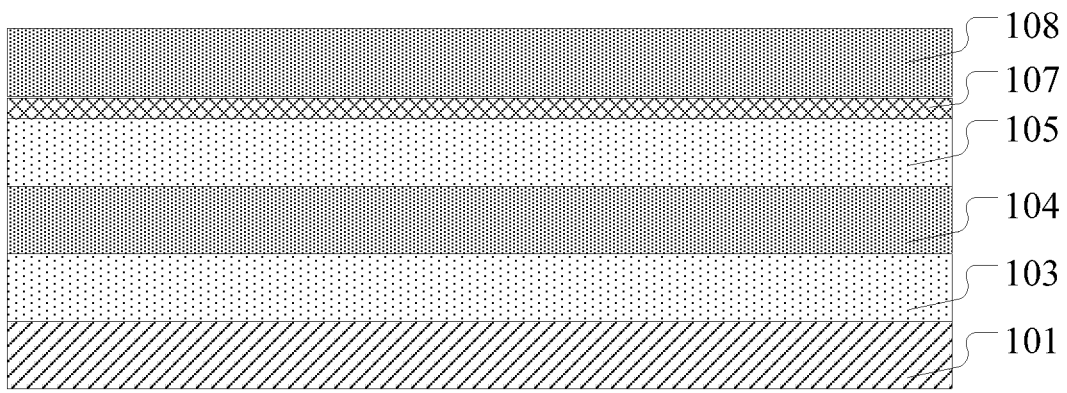

FIG. 5

Forming a black matrix layer on a base substrate, and etching the black matrix layer to form a first groove penetrating through the black matrix layer

Sequentially forming a first organic insulating layer and a second organic insulating layer on the black matrix layer

Respectively etching the first organic insulating layer and the second organic insulating layer to form a second groove and a third groove corresponding to the first groove, the first groove, the second groove and the third groove being interpenetrated with each other

FIG. 6

PANEL AND MANUFACTURING METHOD THEREOF

The application is a U.S. National Phase Entry of International Application No. PCT/CN2017/076246 filed on Mar. 10, 2017, designating the United States of America and claiming priority to Chinese Patent Application No. 201610697354.5 filed on Aug. 19, 2016. The present application claims priority to and the benefit of the above-identified applications and the above-identified applications are incorporated by reference herein in their entirety.

TECHNICAL FIELD

Embodiments of the present disclosure relate to a panel and a manufacturing method thereof.

BACKGROUND

With rapid development of a communication technology, electronic devices such as smart phones and tablet computers have been widely applied to various fields of work and life. In the global market of increasingly fierce competition, manufacturers of the electronic devices are more and more prone to strictly manage and use a unified standard logo to establish a more effective and clearer market image for themselves.

Generally, the manufacturing of a panel with a logo pattern contains multiple procedures, the respective procedures may be operated in different workshops, so the waiting time during the panel is transferred from the previous procedure to the next procedure may be longer. Therefore, in the process of forming the logo pattern, after a layer of ink is formed and before the next procedure is carried out, a layer of protective film is required to cover the ink to prevent external impurities from polluting the layer of ink, or the surface of the ink is required to be swept with a hairbrush before the next procedure is carried out. If an adhesive force of the ink is lower, the ink may be removed in a process of removing the protective film, or the ink will fall off when the surface of the ink is swept by the hairbrush. Besides, when a product is repaired, if the adhesive force of the layer of print layer is lower, the layer of ink may fall off, such that people cannot accept the logo pattern. Therefore, how to improve the adhesive force of the ink is one of problems to be solved.

SUMMARY

At least one of the embodiments of the present disclosure provides a panel, comprising: a base substrate, and a black matrix layer, a first organic insulating layer and a second organic insulating layer, which are sequentially disposed on the base substrate, wherein the black matrix layer comprises a first groove penetrating through the black matrix layer; the first organic insulating layer comprises a second groove penetrating through the first organic insulating layer; the second organic insulating layer comprises a third groove penetrating through the second organic insulating layer; and the first groove, the second groove and the third groove are interpenetrated with one another.

For example, in the panel provided by at least one of the embodiments of the present disclosure, a plane parallel with the base substrate has a first direction, and sizes of the first groove, the second groove and the third groove are gradually increased in the first direction.

For example, in the panel provided by at least one of the embodiments of the present disclosure, a first interval d1 exists between an edge, where the second groove is disposed, of the first organic insulating layer and an edge, where the first groove is disposed, of the black matrix layer at the same side as the edge of the first organic insulating layer.

For example, in the panel provided by at least one of the embodiments of the present disclosure, the first interval d1 ranges from 800 µm to 1200 µm.

For example, in the panel provided by at least one of the embodiments of the present disclosure, the plane parallel with the base substrate further has a second direction perpendicular to the first direction, and a second interval d2 exists between the edge, where the second groove is disposed, of the first organic insulating layer and the edge, where the third groove is disposed, of the second organic insulating layer at the same side as the edge of the first organic insulating layer in both the first direction and the second direction.

For example, in the panel provided by at least one of the embodiments of the present disclosure, the second interval d2 ranges from 800 µm to 1200 µm.

For example, in the panel provided by at least one of the embodiments of the present disclosure, a thickness of the first organic insulating layer is from 0.5 µm to 3 µm.

For example, in the panel provided by at least one of the embodiments of the present disclosure, a thickness of the second organic insulating layer is from 0.5 µm to 3 µm.

For example, the panel provided by at least one of the embodiments of the present disclosure further comprises a transparent inorganic insulating layer disposed between the first organic insulating layer and the second organic insulating layer, wherein the inorganic insulating layer overlays regions corresponding to the first groove, the second groove and the third groove.

For example, in the panel provided by at least one of the embodiments of the present disclosure, a thickness of the inorganic insulating layer is from 0.08 µm to 0.12 µm.

For example, in the panel provided by at least one of the embodiments of the present disclosure, an ink is filled into each of the first groove, the second groove and the third groove and overlays the inorganic insulating layer.

For example, in the panel provided by at least one of the embodiments of the present disclosure, a material of the black matrix layer comprises resin or metal.

For example, in the panel provided by at least one of the embodiments of the present disclosure, a thickness of the black matrix layer is from 0.5 µm to 3 µm.

At least one of the embodiments of the present disclosure provides a manufacturing method for a panel, comprising: forming a black matrix layer on a base substrate, and etching the black matrix layer to form a first groove penetrating through the black matrix layer; sequentially forming a first organic insulating layer and a second organic insulating layer on the black matrix layer; and respectively etching the first organic insulating layer and the second organic insulating layer to form a second groove and a third groove corresponding to the first groove, the first groove, the second groove and the third groove being interpenetrated with one another.

For example, in the manufacturing method provided by at least one of the embodiments of the present disclosure, a plane parallel with the base substrate has a first direction, and sizes of the first groove, the second groove and the third groove are gradually increased in the first direction.

For example, in the manufacturing method provided by at least one of the embodiments of the present disclosure, a first interval d1 exists between an edge, where the second groove is disposed, of the first organic insulating layer and an edge, where the first groove is disposed, of the black matrix layer at the same side as the edge of the first organic insulating layer.

For example, in the manufacturing method provided by at least one of the embodiments of the present disclosure, the first interval d1 ranges from 800 μm to 1200 μm.

For example, in the manufacturing method provided by at least one of the embodiments of the present disclosure, the plane parallel with the base substrate further has a second direction perpendicular to the first direction, and a second interval d2 exists between the edge, where the second groove is disposed, of the first organic insulating layer and the edge, where the third groove is disposed, of the second organic insulating layer at the same side as the edge of the first organic insulating layer in both the first direction and the second direction.

For example, in the manufacturing method provided by at least one of the embodiments of the present disclosure, the second interval d2 ranges from 800 μm to 1200 μm.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 4 is a schematic diagram of a film layer structure of an edge region outside a logo pattern of the panel;

FIG. 5 is a schematic diagram of a film layer structure of a middle region outside a logo pattern of the panel; and FIG. 6 is a flowchart of a manufacturing method of a panel provided by an embodiment of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may comprise an electrical connection, directly or indirectly. "On," "under," "right," "left" and the like are only used to indicate relative position relationship, and when the position of the object which is described is changed, the relative position relationship may be changed accordingly.

An inventor of the present disclosure finds in the process of manufacturing a panel having a logo pattern that an adhesive force of ink depends on a size and a thickness of each film layer as well as an interval between two adjacent film layer. The inventor designs a panel, which is suitable for common ink and common base substrates, and through experimental test on the adhesive force, it is found that the adhesive force of an ink layer formed on the panel structure is relatively higher, and is suitable for manufacturing the logo pattern.

At least one embodiment of the present disclosure provides a panel, comprising: a base substrate, on which a black matrix layer, a first organic insulating layer and a second organic insulating layer are sequentially disposed, wherein the black matrix layer comprises a first groove penetrating through the black matrix layer; the first organic insulating layer comprises a second groove penetrating through the first organic insulating layer; the second organic insulating layer comprises a third groove penetrating through the second organic insulating layer; and the first groove, the second groove and the third groove are interpenetrated with one another.

Figure 1:
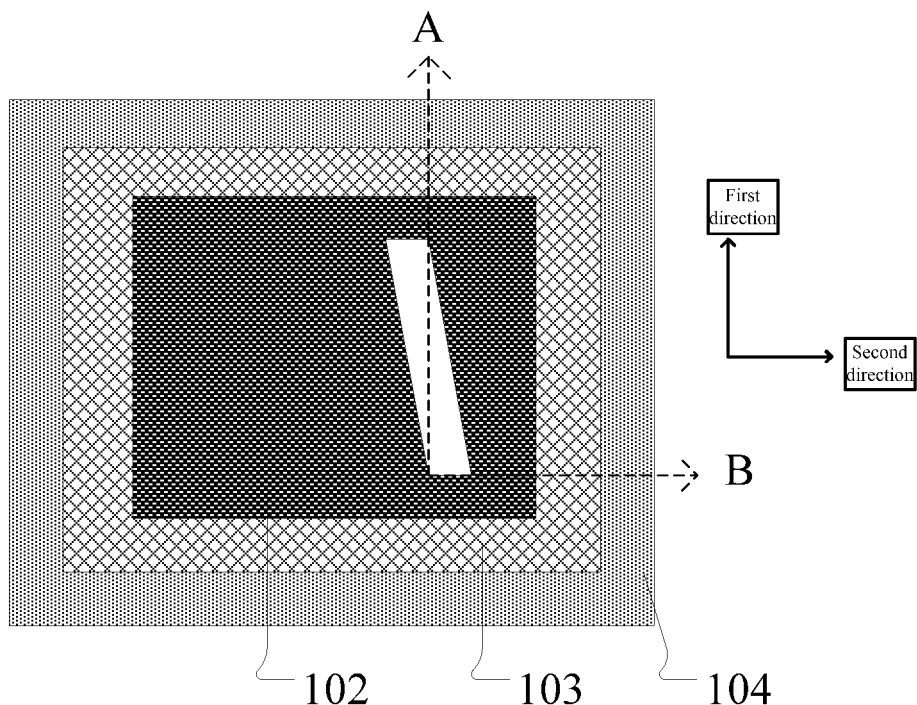
FIG. 1 is a schematic plane view of a panel provided by an embodiment of the present disclosure.
Figure 2:
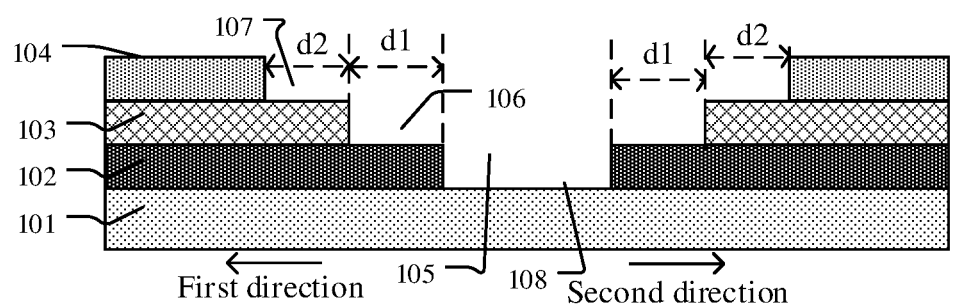
FIG. 2 is a schematic cross-section view taken along A-B of the panel in FIG. 1.

An embodiment of the present disclosure provides a panel. FIG. 1 is a schematic plan view of the panel provided by the embodiment of the present disclosure, and FIG. 2 is a schematic cross-section view taken along line A-B of the panel in FIG. 1. With reference to FIGS. 1 and 2, by taking a structure nearby the logo pattern as an example, the panel comprises 100 comprises a base substrate 101, on which a black matrix layer 102, a first organic insulating layer 103 and a second organic insulating layer 104 are sequentially disposed, wherein the black matrix layer 102 comprises a first groove 105 penetrating through the black matrix layer 102; the first organic insulating layer 103 comprises a second groove 106 penetrating through the first organic insulating layer 103; the second organic insulating layer 104 comprises a third groove 107 penetrating through the second organic insulating layer 104; and the first groove 105, the second groove 106 and the third groove 107 are interpenetrated with one another, thereby forming a region capable of containing the ink.

For example, as illustrated in FIGS. 1 and 2, a plane parallel with the base substrate 101 has a first direction, and sizes of the first groove 105, the second groove 106 and the third groove 107 are gradually increased in the first direction, therefore, the second groove 106 can expose the complete first groove 105, and the third groove 107 can expose the complete second groove 106. In this way, a length of the logo pattern in the first direction is the length of an orthogonal projection of the first groove 105 of the black matrix layer 102 on the base substrate 101 in the first direction.

For example, as illustrated in FIG. 2, a first interval d1 exists between an edge, where the second groove 106 is disposed, of the first organic insulating layer 103 and an edge, where the first groove 105 is disposed, of the black matrix layer 102 which is located on the same side as the edge of the first organic insulating layer 103.

For example, the first interval d1 ranges from 800 μm to 1200 μm, for example, the first interval d1 is approximately 800 μm, 1000 μm or 1200 μm.

For example, as illustrated in FIGS. 1 and 2, the plane parallel with the base substrate 101 further has a second direction perpendicular to the first direction, and a second interval d2 exists between the edge, where the second groove 106 is disposed, of the first organic insulating layer 103 and the edge, where the third groove 107 is disposed, of the second organic insulating layer 104 which is located on the same side as the edge of the first organic insulating layer 103 in both the first and second directions.

For example, as illustrated in FIG. 2, the second interval d2 ranges from 800 μm to 1200 μm, for example, the second interval d2 is approximately 800 μm, 1000 μm or 1200 μm.

For example, as illustrated in FIG. 2, a thickness of the first organic insulating layer 103 is from 0.5 μm to 3 μm, for example, the thickness of the first organic insulating layer 103 is approximately 1 μm, 1.5 μm or 2 μm.

For example, as illustrated in FIG. 2, a thickness of the second organic insulating layer 104 is from 0.5 μm to 3 μm, for example, the thickness of the second organic insulating layer 104 is approximately 1 μm, 1.5 μm or 2 μm.

For example, a material of each of the first organic insulating layer and the second organic insulating layer comprises Benzocyclobutene (BCB).

Figure 3:
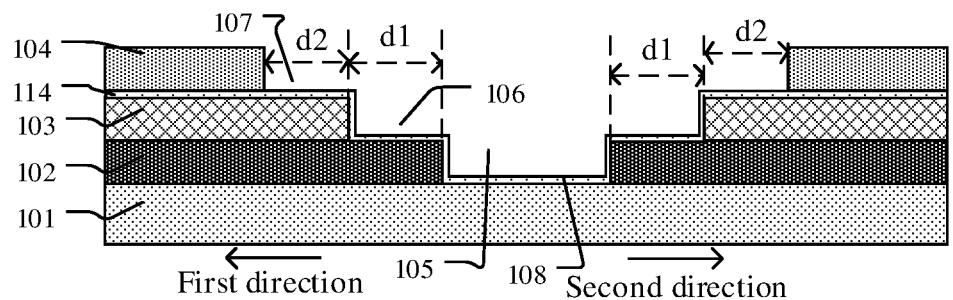
FIG. 3 is another schematic cross-section view at a logo pattern position of the panel.

For example, FIG. 3 is another schematic cross-section view at the position of a logo pattern of the panel. A difference from the section structure in FIG. 2 is that the panel further comprises a transparent inorganic insulating layer 108 disposed between the first organic insulating layer 103 and the second organic insulating layer 104, wherein the inorganic insulating layer 108 overlays the exposed regions corresponding to the first groove 105, the second groove 106 and the third groove 107, respectively. For example, the panel is a touch panel or a display panel. For example, if the panel is the touch panel, then a transparent conductive film layer made of ITO, IZO or IGZO is disposed in a touch region or display region of the touch panel. In this case, the inorganic insulating layer 108 is formed on such transparent conductive film layer to play a role of the optical shadow removal for the transparent conductive film layer. The transparent conductive film layer is not illustrated in FIG. 3.

For example, as illustrated in FIG. 3, a thickness of the inorganic insulating layer is from 0.08 μm to 0.12 μm, for example, the thickness of the inorganic insulating layer is approximately 0.08 μm, 0.1 μm or 0.12 μm. A material of the inorganic insulating layer comprises oxides of silicon, nitrides of silicon and nitric oxides of silicon, and such inorganic insulating layer may be deposited by sputtering method.

For example, as illustrated in FIG. 2 or FIG. 3, the ink is filled into each of the first groove, the second groove and the third groove and overlays the inorganic insulating layer, therefore, a brighter logo pattern is formed, and the logo pattern can be more attractive.

For example, types of the ink comprise mirror-like silver, Pantone 8403C, Pantone 8001C and PMS 877C.

For example, the base substrate comprises soda tempered glass or CT40 tempered glass.

For example, a material of the black matrix layer comprises resin, metal, metal oxides or metal nitrides, etc. For example, the material of the black matrix layer comprises at least one of molybdenum, chromium, aluminum, titanium or copper. For example, the material of the black matrix layer comprises at least one of metal oxide or metal nitride of the molybdenum, chromium, aluminum, titanium or copper. For example, the material of the black matrix layer comprises at least one of molybdenum tantalum oxides, molybdenum titanium oxides, molybdenum tantalum nitrides or molybdenum titanium nitrides. For example, the material of the black matrix layer comprises epoxy resin, acrylic resin, siloxane polymer resin and polyimide resin, etc.

For example, a thickness of the black matrix layer is from 0.5 μm to 3 μm, and for example, is approximately 1 μm, 1.5 μm or 2 μm.

The ink layer located in each of the first groove, the second groove and the third groove and overlaying the inorganic insulating layer in the panel of the embodiment of the present disclosure is subjected to an adhesive force tested by using a Cross-Cut Tester method. Such test method comprises: dividing the ink layer into small squares with uniform area, size and shape, after dividing, using an adhesive tape with certain adhesive capacity to adhere the ink layer, then removing the adhesive tape, and finally confirming the number of the peeled small squares of the ink layer, and comparing a percentage of the peeled small squares to the total number of the small squares with a standard value to obtain the magnitude of the adhesive force of such ink layer.

For example, FIG. 4 is a schematic diagram of a film layer of an edge region outside a logo pattern of the panel. As illustrated in FIG. 4, by taking the touch panel as an example for explanation, the black matrix layer 102, a first conductive layer 111, the first organic insulating layer 103, a second conductive layer 112, a metal layer 113, an inorganic insulating layer 114 and the second organic insulating layer 104 are sequentially disposed on a base substrate 101. For example, a material of each of the first conductive layer 111 and the second conductive layer 112 may be transparent ITO, IZO or IGZO. The first organic insulating layer 103 is disposed between the first conductive layer 111 and the second conductive layer 112 to ensure that a capacitance is formed between the first conductive layer 111 and the second conductive layer 112. For example, some metal wirings, such as touch drive wires, touch sensing wires, gate lines, data lines, etc., are disposed on the touch panel, for example, disposed in the metal layer 113 overlaying the second conductive layer 112. A material of the metal layer 113 may be molybdenum, copper, chromium, or aluminum, etc., and these metal wirings are for example disposed in an edge region of the panel. For example, in order to remove a shadow of the transparent conductive layer in a central visible region, one layer of thinner inorganic insulating layer 114 is disposed thereon, and meanwhile, in order to ensure electric connection between the second conductive layer 112 and the metal layer 113, the inorganic insulating layer 114 is disposed on the metal layer 113. The inorganic insulating layer is deposited on the metal layer 113 and the second conductive layer 112 by sputtering (for example, magnetron sputtering) method, however, the cost for forming the inorganic insulating layer is higher, the inorganic insulating layer cannot be made thick easily, the ultrathin inorganic insulating layer cannot play a role of insulation protection well, in this case, the second organic insulating layer 104 is for example formed on the inorganic insulating layer. 114

FIG. 5 is a schematic diagram of a film layer of a central region outside a logo pattern of the panel. As illustrated in FIG. 5, by taking the touch panel as an example for explanation, the first conductive layer 111, the first organic insulating layer 103, the second conductive layer 112, the inorganic insulating layer 114 and the second organic insulating layer 104 are sequentially disposed on a base substrate 101. The inorganic insulating layer 114 is disposed on the second conductive layer 112 and plays a role of shade removal for the transparent conductive film (second conductive layer) in a central visible region.

At least one embodiment of the present disclosure further provides a method for manufacturing a panel. For example, FIG. 6 is a flowchart of a method for manufacturing a panel. The manufacturing method comprises: forming a black matrix layer on a base substrate, and etching the black matrix layer to form a first groove penetrating through the black matrix layer; sequentially forming a first organic insulating layer and a second organic insulating layer on the black matrix layer; and respectively etching the first organic insulating layer and the second organic insulating layer to form a second groove and a third groove corresponding to the first groove, the first groove, the second groove and the third groove being interpenetrated with one another.

For example, types of the ink comprise mirror-like silver, Pantone8403C, Pantone8001C and PMS 877C.

For example, the base substrate comprises soda tempered glass or CT40 tempered glass.

For example, a plane parallel with the base substrate has a first direction, and sizes of the first groove, the second groove and the third groove are gradually increased in the first direction.

For example, a first interval d1 exists between an edge, where the second groove is disposed, of the first organic insulating layer and an edge, where the first groove is disposed, of the black matrix layer on the same side as the edge of the first organic insulating layer.

For example, the first interval d1 ranges from 800 µm to 1200 µm, for example, the first interval d1 is approximately 800 µm, 1000 µm or 1200 µm.

For example, the plane parallel with the base substrate further has a second direction perpendicular to the first direction, and a second interval d2 exists between the edge, where the second groove is disposed, of the first organic insulating layer and the edge, where the third groove is disposed, of the second organic insulating layer at the same side as the edge of the first organic insulating layer in both the first and second directions.

For example, the second interval d2 ranges from 800 µm to 1200 µm, for example, the second interval d2 is approximately 800 µm, 1000 µm or 1200 µm.

For example, in a manufacturing process of the panel, a first conductive layer, a second conductive layer, an inorganic insulating layer and a metal layer are further formed, and the formation process for the respective film layers of the panel is described as follows:

A process for manufacturing a black matrix layer on a glass substrate comprises: coating a black matrix film with a photoresist, and then forming a pattern of the required black matrix layer through steps such as exposing, developing, peeling of the photoresist, and the like.

A process of forming the first conductive layer on the black matrix layer comprises: forming an ITO film, an IZO film or an IGZO film through a magnetron sputtering method, then coating the transparent conductive film with photoresist and forming the required transparent conductive layer through steps such as exposing, developing, etching, etc.

A process for forming the first organic insulating layer on the first conductive layer comprise: forming a first organic insulating layer film, coating the first organic insulating layer film with a photoresist, and then forming a pattern of the required first organic insulating layer through steps such as exposing, developing, peeling of the photoresist, and the like.

A process of forming the second conductive layer on the first organic insulating layer comprises: forming an ITO, an IZO or an IGZO film through a magnetron sputtering method, then coating the transparent conductive film with a photoresist, forming a required a pattern of transparent conductive layer through steps such as exposing, developing, etching, etc., and simultaneously forming a corresponding pressure sensing passage.

The process of forming the metal layer on the second conductive layer comprises: forming a metal film through a magnetron sputtering method, then coating the metal film with a photoresist, and then forming the required metal layer through steps such as exposing, developing and etching. For example, a material for the metal film comprises conductive metal, such as copper, aluminum, or chromium, etc.

A process of forming the inorganic insulating layer on the metal layer comprises: forming an inorganic insulating layer film through a magnetron sputtering method, then coating the inorganic insulating layer with a photoresist, and then forming a pattern of required inorganic insulating layer through steps such as exposing, developing, etc. For example, a material of forming such inorganic insulating layer comprises oxides of silicon, nitrides of silicon, or nitric oxides of silicon.

The steps of forming a second organic insulating layer on the metal layer comprise: forming a second organic insulating layer film, coating the second organic insulating layer film with a photoresist, and then forming a pattern of the required second organic insulating layer through the steps such as exposing, developing, peeling of the photoresist and the like.

For example, a material of each of the first organic insulating layer and the second organic insulating layer comprises benzocyclobutene (BCB).

The panel and the manufacturing method thereof provided by the embodiments of the present disclosure at least have the following technical effects: by precisely designing the size and the thickness of each film layer of the panel, and the interval with adjacent film layers, and then printing the ink to a region where a logo pattern is to be formed, the ink is baked to a solid state, finally the ink is subjected to an adhesive capacity test, and it is found that when the panel in the embodiments of the present disclosure is adopted for designing the logo pattern, the ink on each film layer of the panel has better adhesive capacity.

Some points as follows need to be explained:

(1) the drawings of the embodiments of the present disclosure merely are related to the structures involved in the embodiments of the present disclosure, and other structures can refer to general designs.

(2) in order for clearness, in the drawings for describing the embodiments of the present disclosure, thicknesses of the layers or regions are zoomed in or out, that is, these drawings are not drawn according to an actual proportion. It can be appreciated that when the layer, the film, the region or an element such as the base plate is called to be located "on" or "under" another element, this element can be "directly" located "on" or "under" another element, or an intermediate element can exist.

(3) in a case of no conflicts, the embodiments of the present disclosure and the features in the embodiments can be inter-combined to gain new embodiments.

The foregoing embodiments merely are exemplary embodiments of the disclosure, and not intended to define the scope of the disclosure, and the scope of the disclosure is determined by the appended claims.

The application claims priority of Chinese Patent Application No. 201610697354.5 filed on Aug. 19, 2016, the disclosure of which is incorporated herein by reference in its entirety as part of the present application.

The invention claimed is:

1. A panel, comprising:
a base substrate; and
a black matrix layer, a first conductive layer, a first organic insulating layer, a second conductive layer, a metal layer, an inorganic insulating layer, and a second organic insulating layer sequentially disposed on the base substrate, wherein:
the black matrix layer comprises a first groove penetrating through the black matrix layer;
the first organic insulating layer comprises a second groove penetrating through the first organic insulating layer;
the second organic insulating layer comprises a third groove penetrating through the second organic insulating layer, the first groove, the second groove, and the third groove being interpenetrated with one another; and
the inorganic insulating layer is a transparent inorganic insulating layer overlaying regions corresponding to the first groove, the second groove, and the third groove,
the panel further comprising:
an ink layer, located in each of the first groove, the second groove, and the third groove and overlaying the transparent inorganic insulating layer,
wherein the first conductive layer and the second conductive layer are spaced apart and insulated from each other by the first organic insulating layer, such that a capacitance is formed between the first conductive layer and the second conductive layer.

2. The panel according to claim 1, wherein a plane parallel with the base substrate has a first direction, and sizes of the first groove, the second groove and the third groove are gradually increased in the first direction.

3. The panel according to claim 2, wherein a first interval exists between an edge, where the second groove is disposed, of the first organic insulating layer and an edge, where the first groove is disposed, of the black matrix layer at the same side as the edge of the first organic insulating layer.

4. The panel according to claim 3, wherein the first interval ranges from 800 µm to 1200 µm.

5. The panel according to claim 3, wherein the plane parallel with the base substrate further has a second direction perpendicular to the first direction, and a second interval exists between the edge, where the second groove is disposed, of the first organic insulating layer and the edge, where the third groove is disposed, of the second organic insulating layer at the same side as the edge of the first organic insulating layer in both the first direction and the second direction.

6. The panel according to claim 5, wherein the second interval ranges from 800 µm to 1200 µm.

7. The panel according to claim 1, wherein a thickness of the first organic insulating layer is from 0.5 µm to 3 µm.

8. The panel according to claim 1, wherein a thickness of the second organic insulating layer is from 0.5 µm to 3 µm.

9. The panel according to claim 1, wherein a thickness of the transparent inorganic insulating layer is from 0.08 µm to 0.12 µm.

10. The panel according to claim 1, wherein a material of the black matrix layer comprises a resin or a metal.

11. The panel according to claim 10, wherein a thickness of the black matrix layer is from 0.5 µm to 3 µm.

12. A manufacturing method for a panel, comprising:
forming a black matrix layer on a base substrate, and etching the black matrix layer to form a first groove penetrating through the black matrix layer;
forming a first conductive layer on the black matrix layer;
forming a first organic insulating layer on the first conductive layer, wherein the first organic insulating layer comprises a second groove penetrating through the first organic insulating layer;
forming a second conductive layer on the first organic insulating layer;
forming a metal layer on the second conductive layer;
forming an inorganic insulating layer on the metal layer, wherein the inorganic insulating layer is a transparent inorganic insulating layer overlaying regions corresponding to the first groove, the second groove, and the third groove;
forming a second organic insulating layer on the inorganic insulating layer, wherein the second organic insulating layer comprises a third groove penetrating through the second organic insulating layer, the first groove, the second groove, and the third groove being interpenetrated with one another;
and
filling an ink into each of the first groove, the second groove, and the third groove to overlay the transparent inorganic insulating layer,
wherein the first conductive layer and the second conductive layer are spaced apart and insulated from each other by the first organic insulating layer, such that a capacitance is formed between the first conductive layer and the second conductive layer.

13. The manufacturing method according to claim 12, wherein a plane parallel with the base substrate has a first direction, and sizes of the first groove, the second groove, and the third groove are gradually increased in the first direction.

14. The manufacturing method according to claim 13, wherein a first interval exists between an edge, where the second groove is disposed, of the first organic insulating layer and an edge, where the first groove is disposed, of the black matrix layer at the same side as the edge of the first organic insulating layer.

15. The manufacturing method according to claim 14, wherein the first interval ranges from 800 µm to 1200 µm.

16. The manufacturing method according to claim 14, wherein the plane parallel with the base substrate further has a second direction perpendicular to the first direction, and a second interval exists between the edge, where the second groove is disposed, of the first organic insulating layer and the edge, where the third groove is disposed, of the second organic insulating layer at the same side as the edge of the first organic insulating layer in both the first direction and the second direction.

17. The manufacturing method according to claim 16, wherein the second interval ranges from 800 µm to 1200 µm.

18. The panel according to claim 1, wherein the metal layer comprises metal wirings, the metal wirings comprise touch drive wires, touch sensing wires, gate lines, and data lines.

* * * * *